(12) United States Patent
Onsia et al.

(10) Patent No.: US 7,238,291 B2
(45) Date of Patent: Jul. 3, 2007

(54) METHOD FOR REMOVING OXIDES FROM A GE SEMICONDUCTOR SUBSTRATE SURFACE

(75) Inventors: Bart Onsia, Schaarbeek (BE); Ivo Teerlinck, Linden (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 79 days.

(21) Appl. No.: 10/943,494

(22) Filed: Sep. 17, 2004

(65) Prior Publication Data

US 2005/0176260 A1 Aug. 11, 2005

Related U.S. Application Data

(60) Provisional application No. 60/542,608, filed on Feb. 6, 2004.

(51) Int. Cl.
 *H01L 21/306* (2006.01)
(52) U.S. Cl. .............................. 216/2; 216/83; 216/100; 216/108; 252/79.1; 438/752
(58) Field of Classification Search ..................... None
 See application file for complete search history.

(56) References Cited

U.S. PATENT DOCUMENTS 2,827,367 A * 3/1958 Cox ........................... 438/752
3,577,286 A * 5/1971 Berkenblit et al. ............ 117/97
3,979,240 A * 9/1976 Ghezzo ....................... 216/101
4,380,490 A * 4/1983 Aspnes et al. ............... 438/692
5,051,134 A * 9/1991 Schnegg et al. ................ 134/3
5,300,463 A 4/1994 Cathey et al.
6,833,195 B1 * 12/2004 Lei et al. ..................... 428/458
2004/0076813 A1 * 4/2004 Han et al. ................. 428/312.6
2005/0106893 A1 * 5/2005 Wilk .......................... 438/758
2005/0196962 A1 * 9/2005 Demeurisse et al. ........ 438/689

FOREIGN PATENT DOCUMENTS

JP 59-157000 6/1994

OTHER PUBLICATIONS

Lu et al. "Structure of the Cl-passivated Ge (111) surface determined using X-ray absorption and first principles calculations", Surf. Sci., 44, L948 (1999).
Okumura et al. "Carbon contamination free Ge (100) surface cleaning for MBE", Appl. Surf. Sci., 125, 125 (1998).
Deegan et al. "XPS Study of the HF Etching of Native Oxides on Ge (111) and Ge (100) Surfaces", Appl. Surf. Sci. 123/124, 66 (1998).
Hill et al., Chemicala Physics Letters, 44(2), p. 225, (1976).
European Search Report for corresponding European Application No. EP 04447203.3, mailed Jul. 1, 2005.

(Continued)

*Primary Examiner*—Anita Alanko
(74) *Attorney, Agent, or Firm*—Knobbe Martens Olson & Bear LLP

(57) ABSTRACT

This invention relates to a method for removing oxides from the surface of a Ge semiconductor substrate comprising the step of subjecting the surface to a Ge oxide etching solution characterized in that the Ge oxide etching solution removes Ge oxides and Ge sub-oxides from the surface.

10 Claims, 5 Drawing Sheets

OTHER PUBLICATIONS

Deegan, et al., *An X-Ray Photoelectron Spectroscopy Study of the HF Etching of Native Oxides on GE (111) and Ge(100) Surfaces*, Applied Surface Science vol., 123/124, 1998, pp. 66-70 XP 002332288.

Okumura, H, et al, *Corbon Contamination Free Ge(100 Surface Cleaning for MBEn*, Applied Surface Science, vol., 125, 1998, pp. 125-128. XP002332289.

Akane, et al, *New GE Substrates Cleaning Method for Si1-x-yGexCy MOMBE Growth*, Thin Solid Films, Elsevier-Sequioa, S.A. Lausanne, CH, vol. 294, No. 1-2, Feb. 15, 1997, pp. 153-156.

Qing, Ma, et al, *Synchrotron-Radiation-Induced Wet Etching of Germanium*, Applied Physics Letters, American institute of Physics, New York, vol. 81, No. 9, Aug. 26, 2002 pp. 1741-1742.

* cited by examiner

PC, HF 2% 5', H₂O₂ 30% 30", ...

METHOD FOR REMOVING OXIDES FROM A GE SEMICONDUCTOR SUBSTRATE SURFACE

RELATED APPLICATIONS

This application claims the benefit of U.S. Provisional Application No. 60/542,608, filed Feb. 6, 2004.

BACKGROUND OF THE INVENTION

1. Field of the Invention

The present invention relates to a method for removing oxide(s) from a germanium (Ge) semiconductor substrate surface.

It also relates to the Ge semiconductor substrate obtainable by a method according to the invention.

2. Description of the Related Art

In microelectronics industry germanium (Ge) wafers are important substrates with technological applications in optical devices and are very recently introduced as a replacement for silicon (Si) substrates for advanced Integrated Circuit (IC) devices.

Ge has very attractive advantages such as high mobility and compatibility with high-k and III/V materials. Therefore a fundamental understanding of the chemistry of treating Ge-wafers in the various stages of the device production is needed.

Special attention goes to Ge substrate surface preparation where a solution of the problem of how to remove the $GeO_x$ completely from the substrate surface must be found.

Making Ge substrate surface oxide free is of particular importance, for example in case of subsequent epitaxial growth where an interface between the Ge substrate and the epitaxial layer must be avoided.

In literature various treatments are described pretending preparing a perfectly oxide free surface. Various concentrations and durations of HCl and HF dips, eventually cycled with a water rinse, has been suggested.

In "Structure of the Cl-passivated Ge(111) surface determined using X-ray absorption and first principles calculations, Surf. Sci., 44, L948 (1999)", Z. H. Lu et al. teach a method of making a Ge substrate oxide free by means of an HCl(38%):$H_2O$=1:1 mixture.

Deegan and Hughes report a cyclic 50% HF etch followed water rinse procedure (An XPS study of the HF etching of native oxides on Ge(111) and Ge(100) surfaces, Appl. Surf. Sci., 123/124, 66 (1998)).

In "Carbon contamination free Ge(100) surface cleaning for MBE., Appl. Surf. Sci., 125, 125 (1998)", H. Okumura et al. teach e.g. 2.5% HF, 49% HF and HCl(36%):$H_2O$=1:4.

Our experiments with these mixtures, however, have never confirmed the complete absence of oxides on the Ge wafer surface. In all cases a thin Ge sub-oxide was observed by X-ray photoelectron spectroscopy (XPS) measurement of the Ge wafer surface.

SUMMARY OF THE INVENTION

The present invention provides a method that renders a semiconductor wafer surface free from Ge oxides and Ge sub-oxides.

According to the invention a method for removing oxides from the surface of a semiconductor substrate comprises the step of contacting said surface with a (Ge oxide) etching solution characterized in that the Ge oxide etching solution removes Ge oxides and Ge sub-oxides from the surface.

In a method of the invention, said (Ge oxide) etching solution comprises HBr and/or HI.

Said (Ge oxide) etching solution may comprise at least about 30 wt. % HBr, or may comprise about 47 wt. %, 48 wt. %, or 49 wt. % HBr (concentrated HBr).

Said (Ge oxide) etching solution may comprise at least about 30 wt. % HI, or may comprise about 57 wt. % HI (concentrated HI).

A method of the invention may further comprise, after the step of contacting said surface with an etching solution comprising HI, the step of rinsing the Ge semiconductor substrate in de-ionized water (DIW).

A Ge semiconductor substrate obtained by a method according to the invention shows no peak caused by Ge oxide or Ge sub-oxide in an X-ray photoelectron spectroscopy (XPS) spectrum obtained by XPS measurement of the surface of said semiconductor substrate.

Thus the present invention provides a Ge semiconductor substrate treated by an etching solution comprising HBr and/or HI.

DETAILED DESCRIPTION

Figure 1:
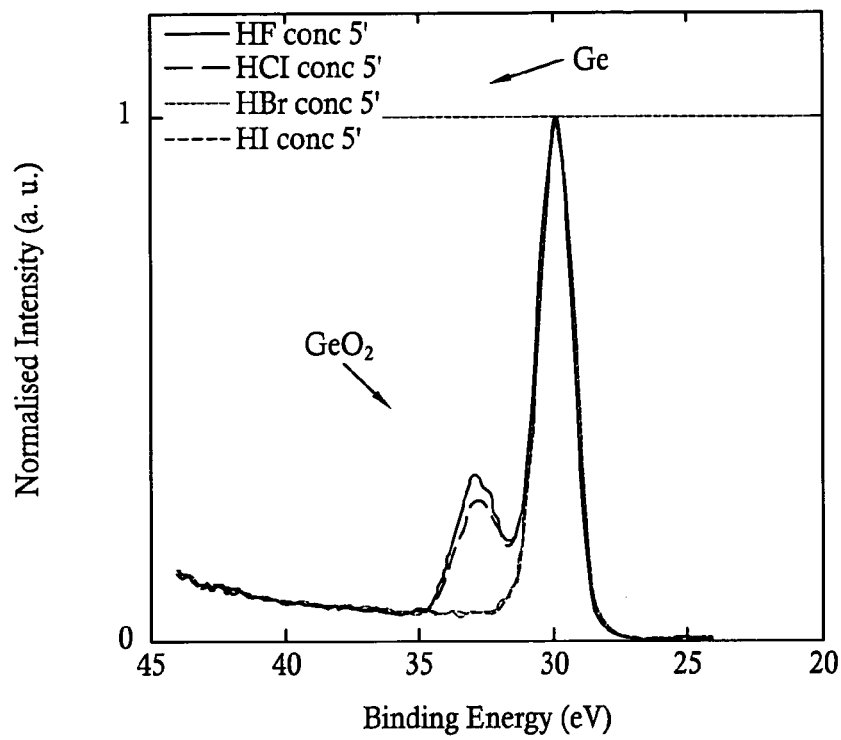
FIG. 1: XPS spectra of oxidized Ge wafers after a dip in various concentrated hydro-halides.

Removing the oxide from a Ge semiconductor substrate surface is of particular importance for further processing on this substrate, especially in case of epitaxial growth.

The presence of any oxide or sub-oxide (any oxide of the form $GeO_x$ with $x \leq 2$) on the substrate surface can be detected by X-ray photoelectron spectroscopy (XPS).

In the context of the present invention, by the term "Ge oxide(s)" is meant $GeO_2$; and by the term "Ge sub-oxide(s)" is meant $GeO_x$, where x is a real number higher than 0 and less than 2 (0<x<2). Nevertheless, the term "Ge oxide(s)", and also the term "oxide(s)", can encompass both "Ge oxide(s)" and "Ge sub-oxide(s)", unless the context clearly dictates otherwise.

The term "substantial" or "substantially" when it refers to the removal of oxides, means that the remaining oxides thickness is less than about 0.3 nm, preferably less than about 0.2 nm, and more preferably less than about 0.1 nm.

The present invention provides a method for removing oxides from the surface of a Ge semiconductor substrate comprising the step of subjecting (or contacting) said surface to (with) an etching solution (or composition) comprising HBr and/or HI.

In a method of the invention, said etching solution comprises at least about 30 wt. % of HBr (i.e. 30 g HBr/100 g solution) and/or HI (i.e. 30 g HI/100 g solution).

Said etching solution may comprise (at least) about 30 wt. %, or (at least) about 40 wt. %, or (at least) about 45 wt. % HBr.

Said etching solution may comprise about 47 wt. %, or about 48 wt. %, or about 49 wt. % HBr (also referred to as concentrated HBr).

Said etching solution may comprise (at least) about 30%, preferably (at least) about 40%, or (at least) about 45 wt. %, more preferably (at least) about 50% HI.

Said etching solution may comprise about 57 wt. % HI (also referred to as concentrated HI).

In a preferred method of the invention, said surface remains in contact with the etching solution about 1 minute, preferably about 3 minutes, more preferably about 5 minutes or more.

A method according to the invention may further comprise, after the step of contacting said surface with a solution (or composition) comprising HBr and/or HI, preferably comprising HI, the step of rinsing said surface in (or with) a de-ionized water (DIW).

Said rinsing step may last few seconds up to hours, and preferably lasts about 1 minute to about 10 minutes.

Said etching solution may comprise (at least) about 30%, preferably (at least) about 40%, or (at least) about 45 wt. %, more preferably at least about 50 wt. % HI.

A preferred etching solution comprises about 57 wt. % HI (also referred to as concentrated HI).

A method according to the invention may further comprise a step of keeping (or storing) the surface free of oxides in $N_2$ atmosphere.

After the contacting step of said surface with a composition comprising HBr and/or HI, and optionally the rinsing step in DIW, said further step of storing the substrate in $N_2$ atmosphere prevents the oxides from reappearing on said Ge substrate surface.

A Ge semiconductor substrate obtained by a method according to the invention has a remaining oxide layer thickness of less than 0.3 nm, preferably less than 0.2 nm and more preferably of less than 0.1 nm.

A Ge semiconductor substrate treated with a solution comprising HBr and/or HI, in particular in the specified concentrations, is and remains substantially free of oxides, even after exposure to (cleanroom) air or oxygen.

The oxide re-grown layer on a Ge semiconductor substrate treated with a solution comprising HBr and/or HI, in particular in the specified concentrations, is less than 0.1 nm after 30 minutes of exposure to air or oxygen, and is less than 0.2 nm after 2 hours of exposure to air or oxygen.

The oxide re-grown layer on a Ge semiconductor substrate treated with a solution comprising HBr and/or HI, in particular in the specified concentrations, and maintained at least 4 hours under $N_2$ atmosphere, is less than 0.1 nm.

A preferred Ge semiconductor substrate treated with a solution comprising HBr, in particular in the specified concentrations, is substantially free of oxides (i.e. has an oxides layer thickness less than 0.3 nm, preferably 0.2 nm, more preferably 0.1 nm). Preferably, said treated Ge semiconductor substrate is stored under $N_2$ atmosphere.

A preferred Ge semiconductor substrate treated with a solution comprising HI, in the specified concentrations, and rinsed with DIW, shows no peak corresponding to Ge oxides or Ge sub-oxides in an XPS spectrum obtained by XPS measurement of the surface of said Ge semiconductor substrate.

All wafers used for the experiments were deliberately pre-treated according to an oxidizing procedure consisting of:

a pre-cleaning sequence (PC), which comprises a very short SC1, SC2 based cleaning step with de-ionized water (DIW) rinses in between, then a 5 minutes HF 2% dip, and finally a 30 seconds concentrated $H_2O_2$ dip to oxidize the wafer surface.

SC1 refers to "standard clean 1" wherein the Ge substrate surface is contacted with an Ammonium-Peroxide-Mixture (APM) comprising a $NH_4OH/H_2O_2/H_2O$ (1/1/5) composition at 70° C. during 10 minutes.

SC2 refers to "standard clean 2" wherein the Ge substrate surface is contacted with an Hydrogen chloride-Peroxide-Mixture (HPM) comprising $HCl/H_2O_2/H_2O$ (1/1/5) composition at 70° C. during 10 minutes.

FIG. 1 shows the X-ray photoelectron spectroscopy (XPS) spectra of 4 oxidized Ge wafers, which had a 5 minutes dip in respectively concentrated HF, concentrated HCl, concentrated HBr and concentrated HI.

It is clearly shown that after the HBr dip only one peak is observed. This peak is the elemental Ge peak. The peak height is normalized to 1. The Ge oxide peak is not present anymore.

After HI dip a very small oxide peak is still present.

After HCl and HF dip, a rather large Ge oxide peak can be observed.

Figure 2:
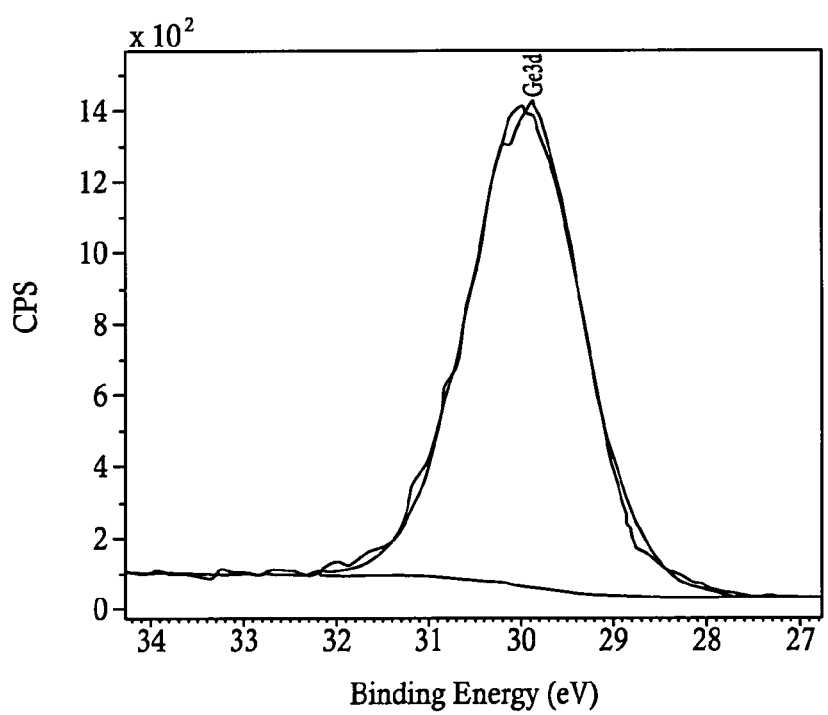
FIG. 2: Detail of the Ge3d XPS spectrum for an oxidized Ge wafer treated 5 minutes with HBr 48%.

FIG. 2 shows in detail the XPS spectrum for a Ge wafer treated with PC, $HF_2$% 5 minutes, $H_2O_2$ 30% 30", HBr 48% 5 minutes.

It is very clear that no oxide or sub-oxide is present anymore.

Figure 3:
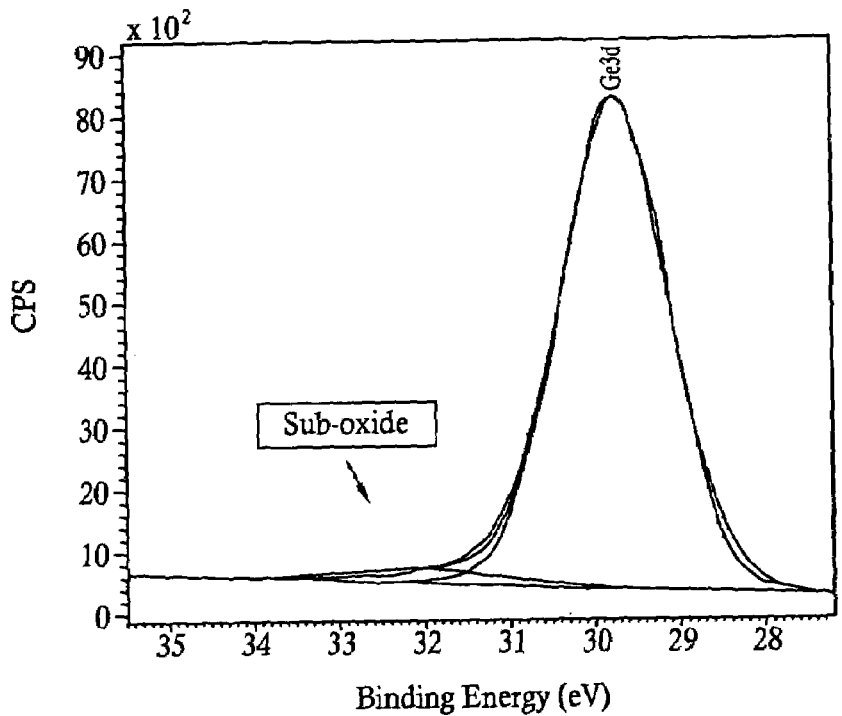
FIG. 3: Detail of the Ge3d XPS spectrum for an oxidized Ge wafer treated 5 minutes with HI 57%.

FIG. 3 shows in detail the XPS spectrum for a Ge wafer treated with PC, $HF_2$% 5 minutes, $H_2O_2$ 30% 30 seconds, HI 57% 5 minutes. Some sub-oxides can still be observed.

Figure 4:
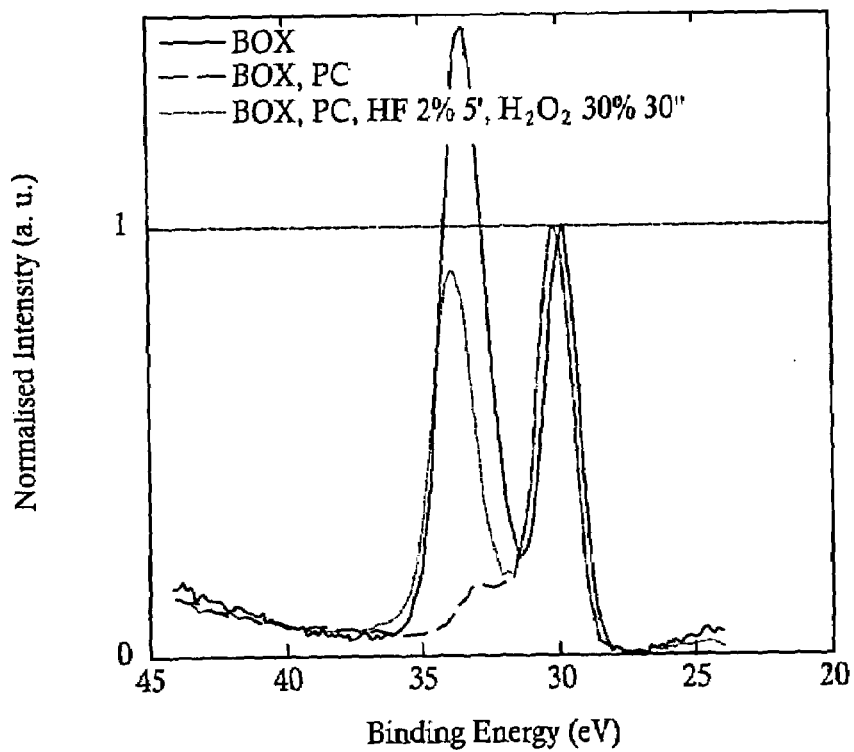
FIG. 4: XPS spectrum of a Ge wafer after various stages of the oxidizing procedure.

In FIG. 4, a Ge wafer was measured after various stages of the pre-treatment procedure: after taking the wafer out of the box, after PC treatment and after HF-dip and re-oxidation with $H_2O_2$.

Figure 5:
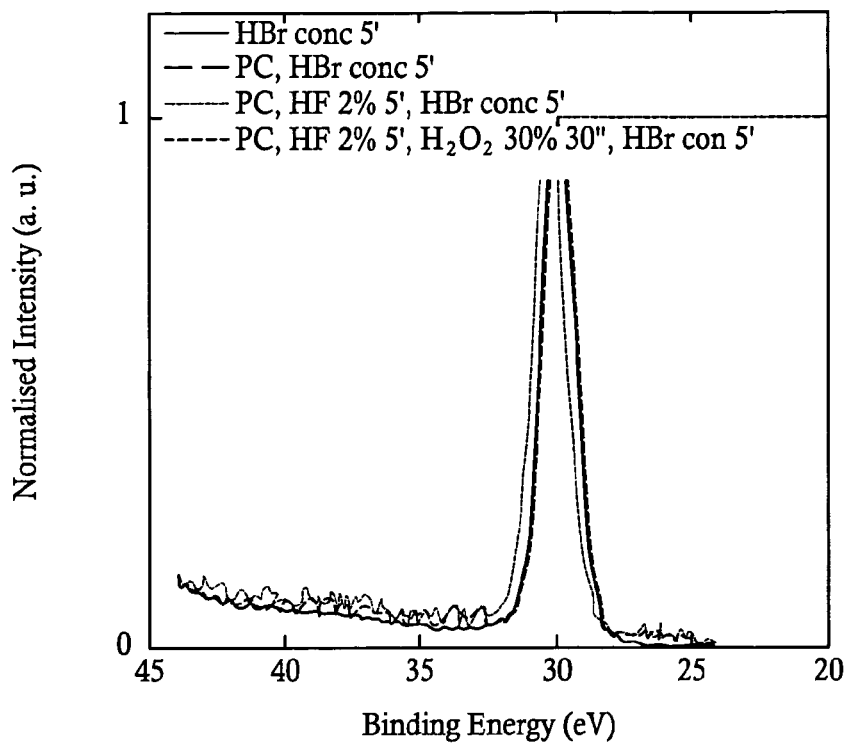
FIG. 5: XPS spectrum of a Ge wafer treated 5 minutes with a concentrated HBr dip after various stages of the oxidizing procedure.

FIG. 5 shows the results of the concentrated HBr dip after the same stages of the pre-treatment procedure shown in FIG. 4.

When comparing these spectra with FIG. 4, it is clear that concentrated HBr removes all Ge oxide, including sub-oxides, in such a way that the removal is independent of the different pre-treatment procedures the Ge surface was exposed to.

In case of concentrated HI treatment, it was observed that there was still a small amount of sub-oxide left after the dip (FIG. 3). This sub-oxide can be removed adding a DIW rinse after the HI dip. The XPS results of this treatment are shown in FIG. 6.

Figure 6:
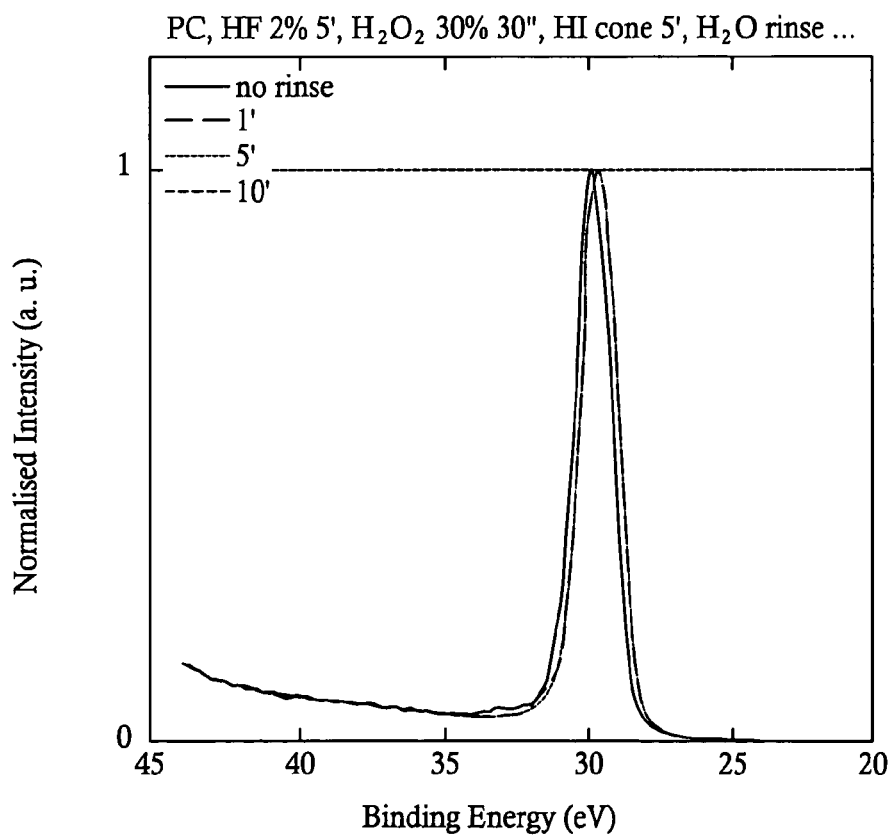
FIG. 6: XPS spectrum of an oxidized Ge wafer treated with a 5 minutes concentrated HI dip and a subsequent rinse in DIW with various rinse times.
Figure 7:
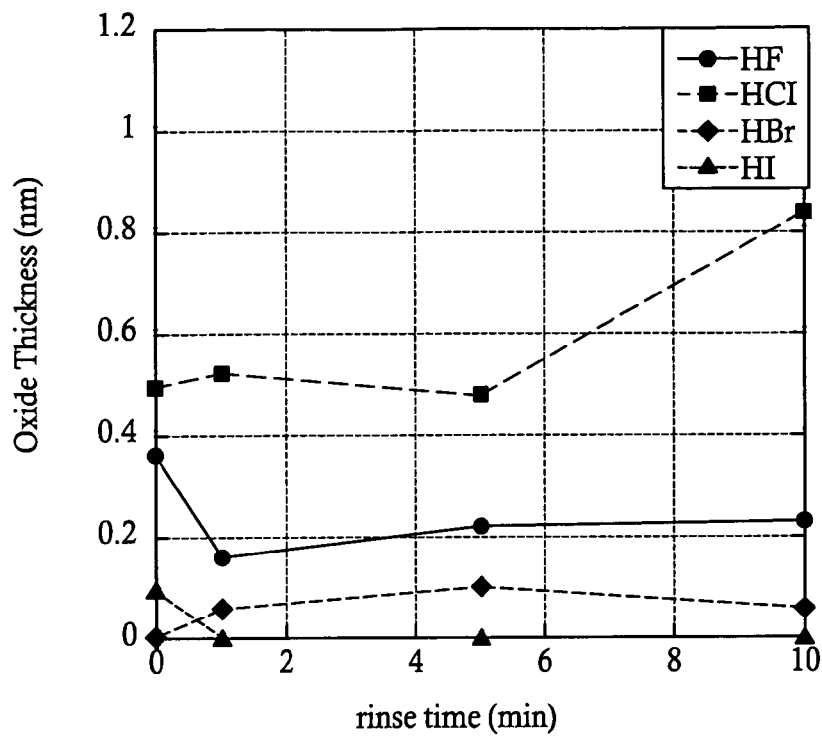
FIG. 7: The oxide thickness on an oxidized Ge wafer surface after a dip in different concentrated hydro-halides followed by a rinse of variable duration in DIW.

Because it is difficult to differentiate in FIG. 6 between remaining sub-oxide for the HI dip without the rinse and complete removal of the oxide with rinse, FIG. 7 was plotted wherein, after treatment with different concentrated hydrohalides and various DIW rinse times, the oxide thickness is calculated based on the peak intensities obtained by XPS and the Hill formula (J. M. Hill et al. Chemical Physics Letters, 44(2), p. 225, (1976)

It is clearly shown that for concentrated HI followed by 1 minute DIW rinse, all oxide is removed and no regrowth (no oxide re-grown layer) can be detected during longer rinse times.

In case of HBr, however, a DIW rinse causes oxide regrowth.

Thus, for substantially removing oxides on top of a Ge wafer surface, a preferred method of the invention comprises the step of contacting a concentrated HBr solution (about 47 wt. % to about 49 wt. %) with said surface.

Another preferred method of the invention comprises the step of contacting a concentrated HI solution (about 57 wt. %) with said surface, followed by the step of rinsing said surface in DIW, e.g. for about 1 minute to about 10 minutes.

Additional experiments were done to investigate the oxide regrowth both in cleanroom air and in $N_2$ atmosphere after treatment in various hydro-halides.

Figure 8:
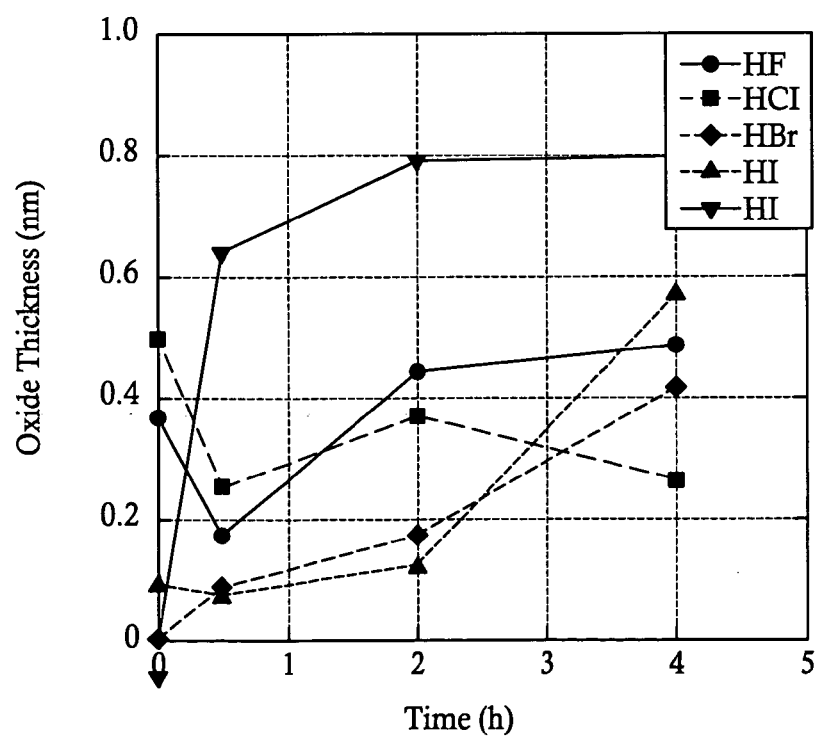
FIG. 8: The oxide thickness on an oxidized Ge wafer surface after a dip in different concentrated hydro-halides followed by exposure to cleanroom air.

FIG. 8 shows oxide regrowth in cleanroom air after treatment in various hydro-halides. After 0.5 hour exposure to cleanroom air, both for concentrated HBr and HI dip, the oxide thickness does not exceed 0.1 nm.

However after HI dip followed by DIW rinse and 0.5 hour exposure to cleanroom air, the oxide thickness increases towards 0.6 nm.

Figure 9:
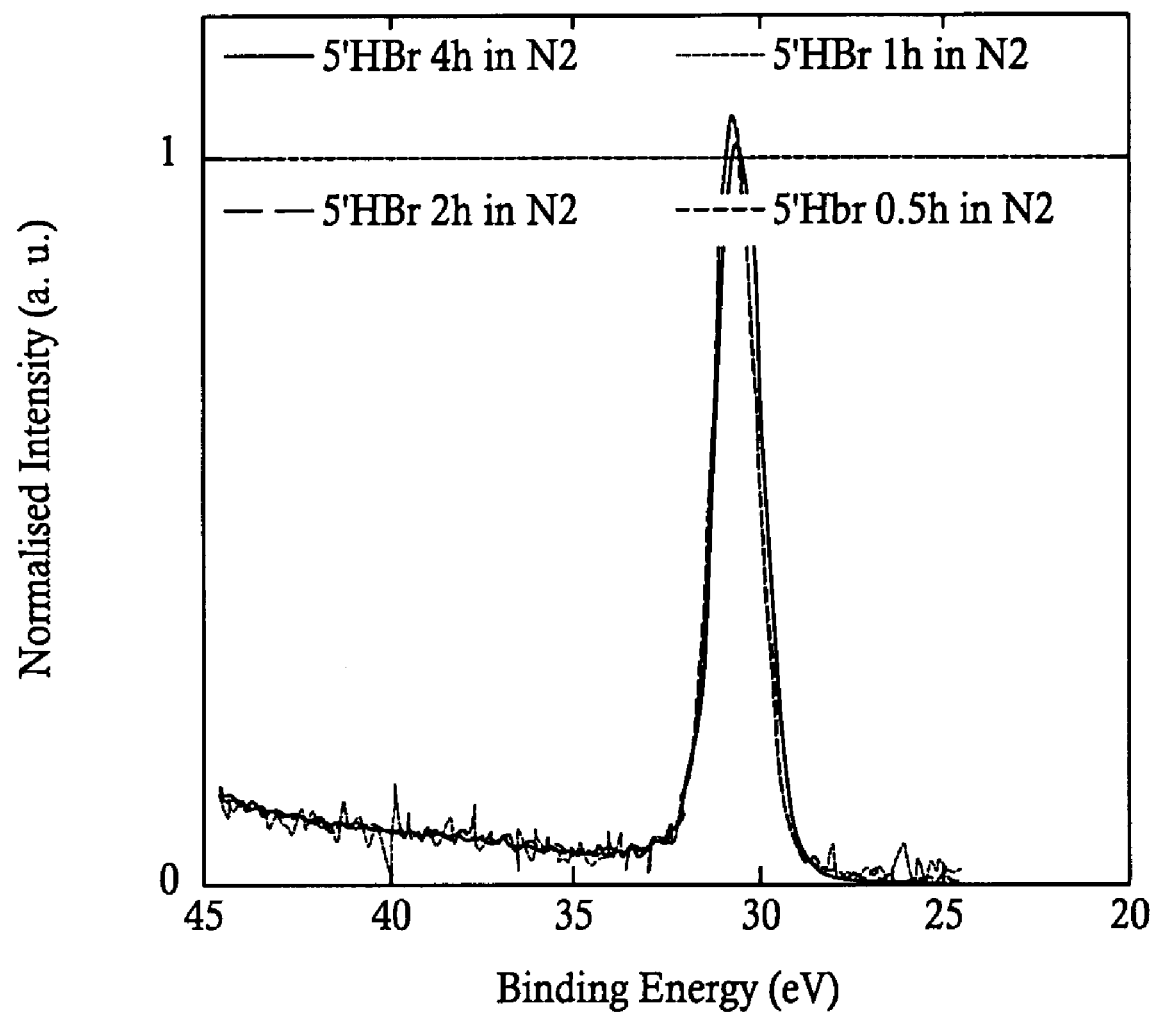
FIG. 9: Stability of oxide free Ge surface in N2 atmosphere after treatment with concentrated HBr.

FIG. 9 shows oxide regrowth in N2 atmosphere after 5 minutes in concentrated HBr. Even after 4 hours, no oxide can be detected by XPS. An additional test not shown in this figure proved that even after 24 hours no oxide growth could be detected.

The present invention provides thus a method with a very low temperature budget, since currently Ge oxides are removed by a heating step in $H_2$ atmosphere ($H_2$ bake), generating a very high temperature budget. A heating step with such temperature budget is usually not allowed in semiconductor processing due to diffusion problems, relaxation, etc.

Moreover, a method of the invention can also be implemented in a Ge cleaning process flow (as an oxide removal step) contrary to the heating step.

What is claimed is:

1. A method for removing germanium oxides or germanium sub-oxides from the surface of a Ge semiconductor substrate comprising the steps of contacting said surface with an etching solution comprising HI at a concentration of at least 30 wt. %, and thereafter rinsing said surface in de-ionized water, whereby said surface is rendered free from Ge oxides and Ge sub-oxides.

2. A method according to claim 1, wherein the HI concentration is at least 40 wt. %.

3. A method according to claim 1, wherein the HI concentration is at least 45 wt. %.

4. A method according to claim 1, wherein the HI concentration is at least 50 wt. %.

5. A method according to claim 1, further comprising the step of maintaining said surface rendered free from Ge oxides and Ge sub-oxides under $N_2$ atmosphere.

6. A method according to claim 1, wherein an XPS spectrum obtained by XPS measurement of said surface after the rinsing step shows no peak corresponding to Ge oxides or Ge sub-oxides.

7. A method according to claim 1, wherein the etching solution is a concentrated HI solution.

8. A method according to claim 1, wherein said surface rendered free from Ge oxides and Ge sub-oxides has an oxides layer thickness of less than 0.3 nm.

9. A method according to claim 1, wherein said surface rendered free from Ge oxides and Ge sub-oxides has an oxides layer thickness of less than 0.2 nm.

10. A method according to claim 1, wherein said surface rendered free from Ge oxides and Ge sub-oxides has an oxides layer thickness of less than 0.1 nm.

* * * * *